(12) United States Patent
Nishimura et al.

(10) Patent No.: US 7,560,925 B1
(45) Date of Patent: Jul. 14, 2009

(54) MULTIPLE REPETITION TIME STEADY-STATE FREE PRECESSION IMAGING

(75) Inventors: Dwight G. Nishimura, Palo Alto, CA (US); Tolga Cukur, Stanford, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 0 days.

(21) Appl. No.: 12/113,848

(22) Filed: May 1, 2008

(51) Int. Cl.
*G01V 3/00* (2006.01)
(52) U.S. Cl. ...................... 324/309; 324/307
(58) Field of Classification Search ......... 324/300–322; 600/407–445; 128/898; 382/128
See application file for complete search history.

(56) References Cited

U.S. PATENT DOCUMENTS

| 6,307,368 | B1 | 10/2001 | Vasanawala et al. | |
|---|---|---|---|---|
| 6,586,933 | B1 | 7/2003 | Hardy et al. | |
| 6,608,479 | B1 * | 8/2003 | Dixon et al. | 324/307 |
| 6,714,807 | B2 | 3/2004 | Zur | |
| 6,750,651 | B2 | 6/2004 | Overall | |
| 7,046,003 | B2 * | 5/2006 | Hargreaves et al. | 324/307 |
| 7,116,105 | B1 * | 10/2006 | Zhang | 324/307 |
| 7,167,003 | B2 * | 1/2007 | Eberhardt et al. | 324/318 |
| 7,253,620 | B1 * | 8/2007 | Derbyshire et al. | 324/307 |
| 7,332,908 | B2 * | 2/2008 | Nayak et al. | 324/307 |
| 2006/0161060 | A1 * | 7/2006 | Pai | 600/431 |
| 2007/0225591 | A1 * | 9/2007 | Derbyshire et al. | 600/410 |
| 2008/0161678 | A1 * | 7/2008 | Miyazaki et al. | 600/419 |

OTHER PUBLICATIONS

H. Y. Carr, "Steady-State Free Precession in Nuclear Magnetic Resonance," Physical Review, vol. 112, No. 5, pp. 1693-1701, 1958.
Deshpande et al., "3D Magnetization-Prepared True-FISP: A New Technique for Imaging Coronary Arteries," Magnetic Resonance in Medicine, vol. 46, pp. 494-502, 2001.
Hargreaves et al., "Comparison of New Sequences for High-Resolution Cartilage Imaging," Magnetic Resonance in Medicine, vol. 49, pp. 700-709, 2003.
Brittain et al., "Three-Dimensional Flow-Independent Peripheral Angiography," Magnetic Resonance in Medicine, vol. 38, pp. 343-354, 1997.
Vasanawala et al., "Fluctuating Equilibrium MRI," Magnetic Resonance in Medicine, vol. 42, pp. 876-883, 1999.

(Continued)

*Primary Examiner*—Brij B Shrivastav
(74) *Attorney, Agent, or Firm*—Beyer Law Group LLP

(57) ABSTRACT

A method of providing selective spectral suppression in balanced SSFP magnetic resonance imaging for a first and second species is provided. A plurality of balanced SSFP images are acquired. Each acquisition includes applying RF excitations in a sequence of TR intervals with each being applied in an associated TR interval. The sequence of TR intervals includes at least one data acquisition TR interval and at least two secondary TR intervals each having a duration that is shorter than the data acquisition TR interval. A first secondary TR interval precedes the data acquisition TR interval and a second secondary TR interval follows the data acquisition TR interval. The duration of the second secondary TR interval is substantially equal to the first secondary TR interval such that the sequence of TR intervals is substantially symmetric with respect to duration about a center point of the sequence of TR intervals.

16 Claims, 10 Drawing Sheets

OTHER PUBLICATIONS

Vasanawala et al., "Linear Combination Steady-State Fee Precession MRI," Magnetic Resonance in Medicine, vol. 43, pp. 82-90, 2000.

Hardy et al., "Steady-State Free Precession Imaging with Inherent Fat Suppression," Proc. Intl. Soc. Mag. Reson. Med. 10, p. 473, 2002.

Overall et al., "Steady-State Sequence Synthesis and its application to Efficient Fat-Suppressed Imaging," Magnetic Resonance in Medicine, vol. 50, pp. 550-559, 2003.

Absil et al., "Fat Attenuation Using a Dual Steady-State Balanced-SSFP Sequence With Periodically Variable Flip Angles," Magnetic Resonance in Medicine, vol. 55, pp. 343-351, 2006.

Leupold et al., "Alternating Repetition Time Balanced Steady State Free Precession," Magnetic Resonance in Medicine, vol. 55, pp. 557-565, 2006.

Bangerter et al., "3D Fluid-Suppressed T2-Prep Flow-Independent Angiography using Balanced SSFD," Proc. Intl. Soc. Mag. Reson. Med. 11, p. 11, 2004.

Cukur et al., "Multiple Repetition Time Balanced SSFD for Improved Spectral Response," Proc. Intl. Soc. Mag. Reson. Med. 16, p. 832, 2008.

* cited by examiner

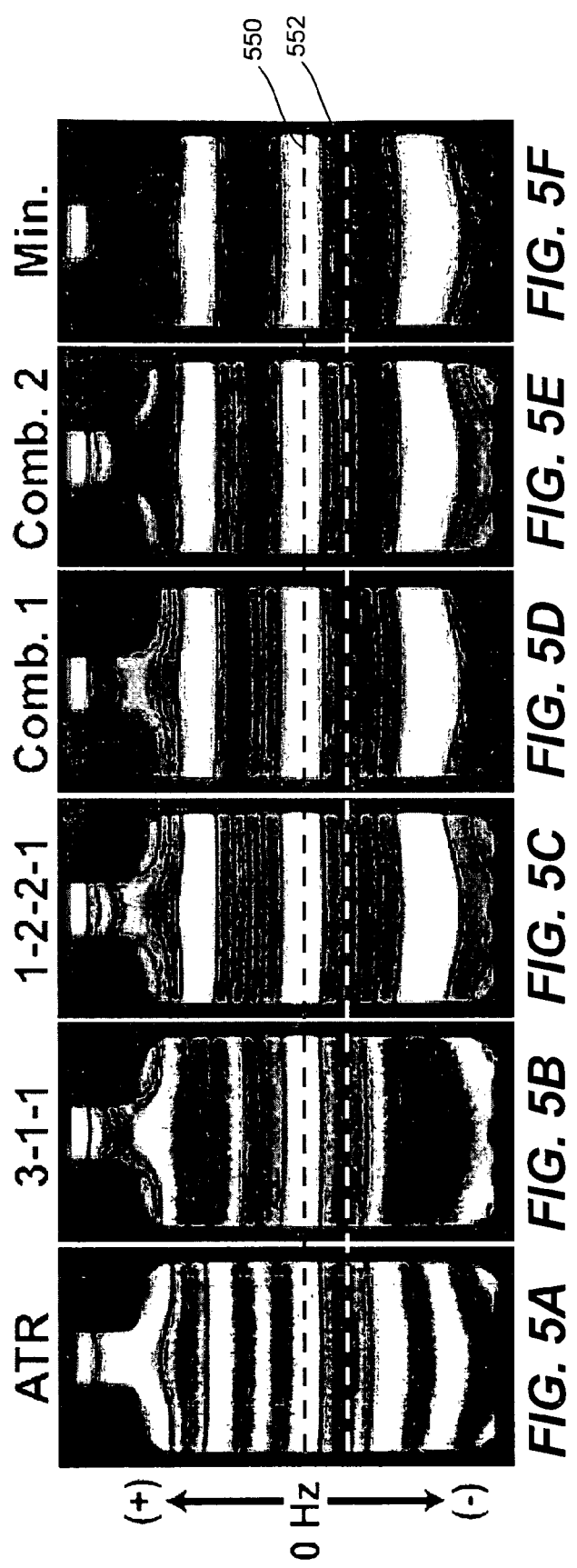

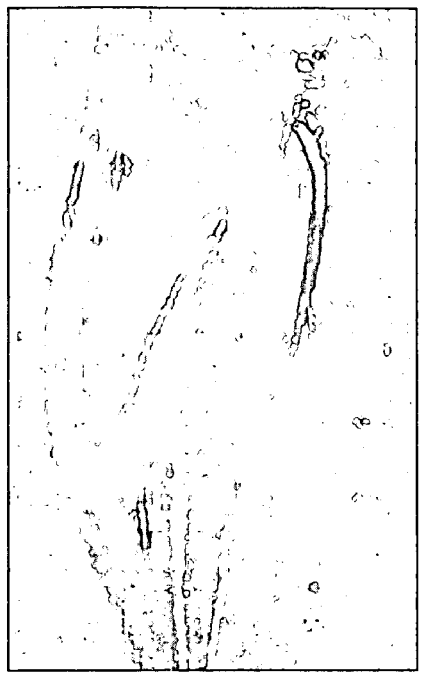
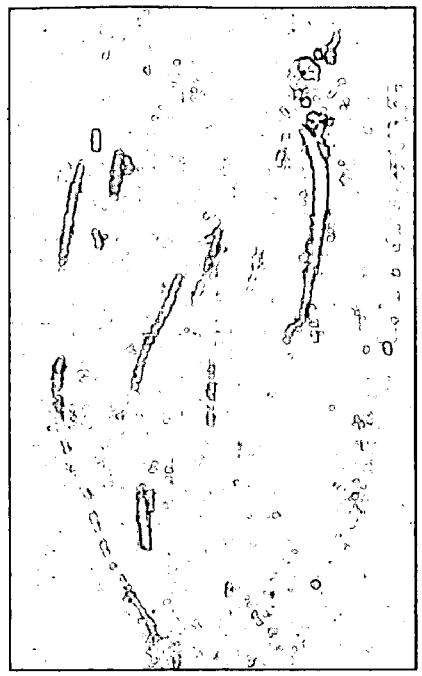
FIG. 6A  FIG. 6B
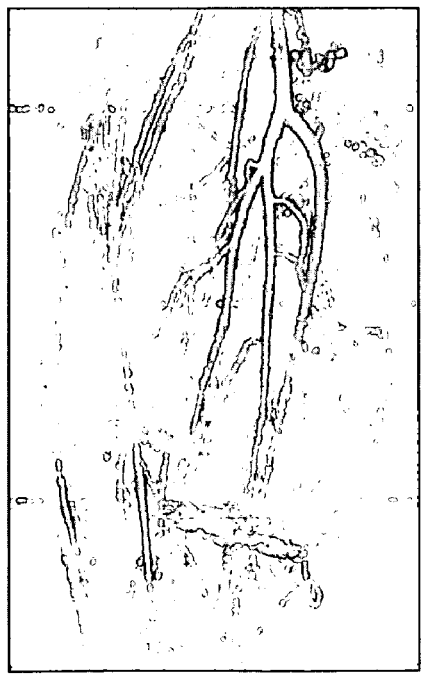
FIG. 6C  FIG. 6D

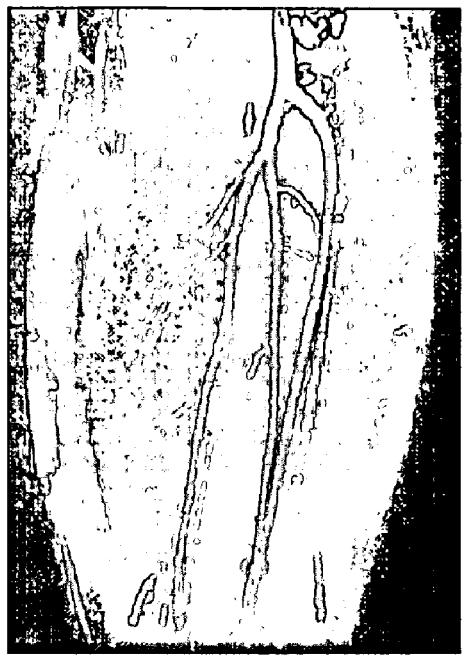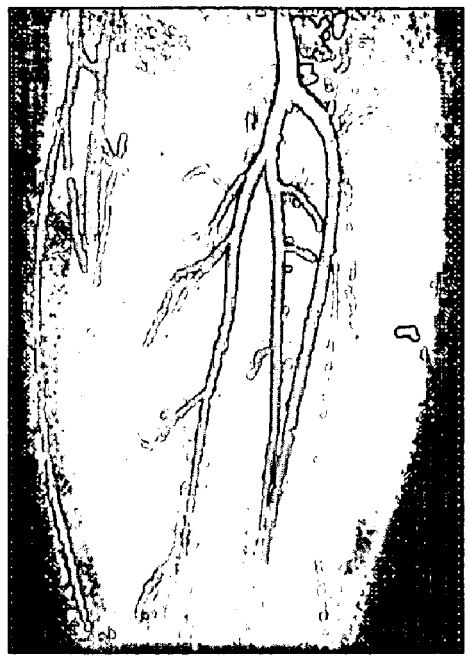
FIG. 7A  FIG. 7B
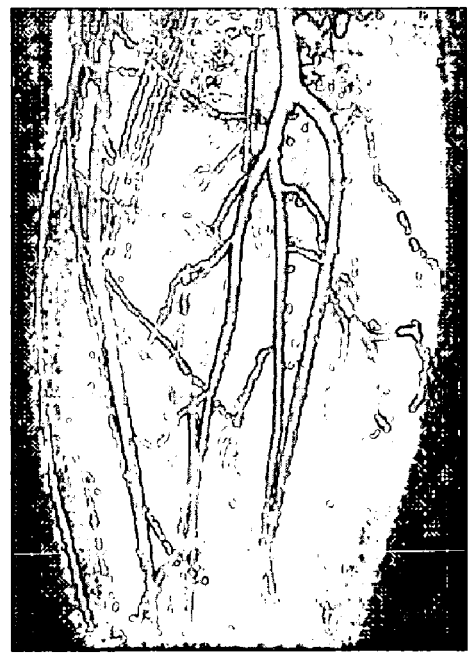
FIG. 7C  FIG. 7D

MULTIPLE REPETITION TIME STEADY-STATE FREE PRECESSION IMAGING

GOVERNMENT RIGHTS

The U.S. government has rights in the disclosed invention pursuant to National Institutes of Health (NIH) grants to Stanford University including R01 HL039297, and R01 HL075803.

FIELD OF THE INVENTION

The present invention relates generally to magnetic resonance imaging (MRI). More particularly, the present invention relates to MRI using multiple repetition time steady-state free precession (SSFP) to provide selective spectral suppression.

BACKGROUND

Magnetic resonance imaging (MRI) is a non-destructive method for the analysis of materials and represents a relatively new approach to medical imaging. It is generally non-invasive and does not involve ionizing radiation. In very general terms, nuclear magnetic moments are excited at specific spin precession frequencies which are proportional to the local magnetic field. The radio-frequency signals resulting from the precession of these spins are received using pickup coils. By manipulating the magnetic fields, an array of signals is provided representing different regions of the volume. These are combined to produce a volumetric image of the nuclear spin density of the body. More specifically, nuclear spins can be viewed as vectors in a three-dimensional space. During an MRI process, each nuclear spin responds to four different effects—precession about the main magnetic field, nutation about an axis perpendicular to the main field, and both transverse and longitudinal relaxation. In steady-state MRI processes, a combination of these effects occurs periodically.

It would be desirable to have a method for spectrally selective imaging of different resonances that provides robust fat suppression over a broad stop-band without sacrificing the pass-band performance.

SUMMARY OF THE DESCRIBED EMBODIMENTS

In accordance with the invention, a method of providing selective spectral suppression in balanced steady-state free procession (SSFP) magnetic resonance imaging for a first species and a second species is provided. A plurality of balanced SSFP images are acquired. Each acquisition of a balanced SSFP image includes applying a sequence of radio frequency (RF) excitations in a sequence of TR intervals with each RF excitation being applied in an associated TR interval. The sequence of TR intervals includes at least one data acquisition TR interval and at least two secondary TR intervals each having a duration that is substantially shorter than a duration of the at least one data acquisition TR interval. A first one of the secondary TR intervals precedes the at least one data acquisition TR interval and a second one of the secondary TR intervals follows the at least one data acquisition TR interval. The duration of the second one of the secondary TR intervals is substantially equal to the duration of the first one of the secondary TR intervals such that the sequence of TR intervals is substantially symmetric with respect to duration about a center point of the sequence of TR intervals. Each acquisition further includes applying balanced magnetic gradients, acquiring a data signal for the first species during each of the at least one data acquisition TR intervals while suppressing a signal from the second species, and generating an image of the first species with the data signal from the first species in which the signal from the second species is suppressed.

In another manifestation of the invention an apparatus that includes a magnet system and a controller electrically connected to the magnet system. The controller further includes a display, at least one processor and computer readable media. The computer readable media includes computer readable code executable by the at least one processor for acquiring a plurality of balanced SSFP images. For each SSFP image the computer readable code is operable to apply a sequence of radio frequency (RF) excitations in a sequence of TR intervals with each RF excitation being applied in an associated TR interval. The sequence of TR intervals includes at least one data acquisition TR interval and at least two secondary TR intervals each having a duration that is substantially shorter than a duration of the at least one data acquisition TR interval. A first one of the secondary TR intervals precedes the at least one data acquisition TR interval and a second one of the secondary TR intervals follows the at least one data acquisition TR interval. The duration of the second one of the secondary TR intervals is substantially equal to the duration of the first one of the secondary TR intervals such that the sequence of TR intervals is substantially symmetric with respect to duration about a center point of the sequence of TR intervals. The computer code is further operable to apply balanced magnetic gradients, acquire a data signal for the first species during each of the at least one data acquisition TR intervals while suppressing a signal from the second species and generate an image of the first species with the data signal from the first species in which the signal from the second species is suppressed.

In yet another manifestation of the invention, another method of providing selective spectral suppression in balanced steady-state free procession (SSFP) magnetic resonance imaging for a first species and a second species is described. Like the above-described method, this method also includes acquiring a plurality of balanced SSFP images. Again, each acquisition of a balanced SSFP image includes applying a sequence of radio frequency (RF) excitations in a sequence of TR intervals with each excitation being applied in an associated TR interval. The sequence of TR intervals includes two adjacent data acquisition TR intervals and at least one secondary TR interval. Each secondary TR interval has a duration that is substantially shorter than a duration of each of the data acquisition TR intervals. Each acquisition further includes applying balanced magnetic gradients, acquiring a data signal for the first species during each of the data acquisition TR intervals while suppressing a signal from the second species, combining the data signals from the data acquisition TR intervals to further suppress the signal from the second species and generating a combined image of the first species with the combined data signals in which the signal from the second species is suppressed.

The invention and objects and features thereof will be more readily apparent from the following detailed description and appended claims when taken in conjunction with the drawings.

BRIEF DESCRIPTION OF THE DRAWINGS

FIGS. 5A-5F illustrate phantom images.

FIG. 6A illustrates an ATR SSFP lower leg image acquired at 1.5 T.

FIG. 6B illustrates a lower leg image acquired at 1.5 T utilizing a multiple-TR sequence in accordance with an example embodiment of the present invention.

FIG. 6C illustrates an ATR SSFP lower leg whole volume maximum-intensity projection image acquired at 1.5 T.

FIG. 6D illustrates a lower leg whole volume maximum-intensity projection image acquired at 1.5 T utilizing a multiple-TR sequence in accordance with an example embodiment of the present invention.

FIG. 7A illustrates an ATR SSFP lower leg thin slab maximum-intensity projection image acquired at 3 T.

FIG. 7B illustrates a lower leg thin slab maximum-intensity projection image acquired at 3 T utilizing a multiple-TR sequence in accordance with an example embodiment of the present invention.

FIG. 7C illustrates an ATR SSFP lower leg whole volume maximum-intensity projection image acquired at 3 T.

FIG. 7D illustrates a lower leg whole volume maximum-intensity projection image acquired at 3 T utilizing a multiple-TR sequence in accordance with an example embodiment of the present invention.

DETAILED DESCRIPTION OF EXAMPLE EMBODIMENTS

Figure 1A:
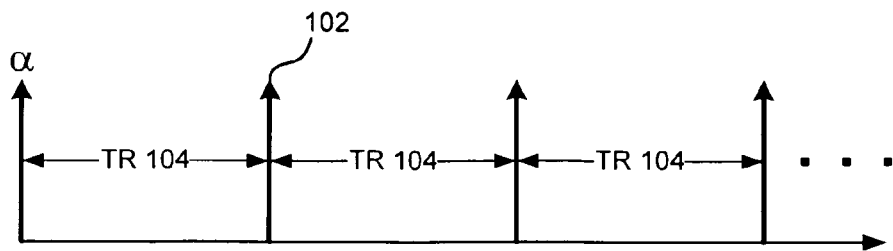
FIG. 1A illustrates a balanced SSFP TR interval sequence.

Reference will now be made in detail to a particular embodiment of the invention, an example of which is illustrated in the accompanying drawings. While the invention will be described in conjunction with the particular embodiment, it will be understood that it is not intended to limit the invention to the described embodiment. To the contrary, it is intended to cover alternatives, modifications, and equivalents as may be included within the spirit and scope of the invention as defined by the appended claims.

Fully-refocused steady-state free precession (SSFP) imaging (also known as balanced SSFP, FIESTA, TrueFISP), provides high signal-to-noise ratio (SNR) efficiency with short repetition times or time intervals (hereinafter referred to as TRs or TR intervals). However, a significant drawback of traditional balanced SSFP techniques is that these techniques cause fat tissue to appear bright in the reconstructed images. The tissues of interest usually have comparable or smaller balanced SSFP signals. Therefore, fat-water separation or fat suppression methods have commonly been coupled with SSFP imaging to improve depiction of the tissues/structures of interest.

A number of interesting strategies have been devised for reducing or suppressing the fat signal. One way of reducing the SSFP fat signal is to shape the periodic frequency response. With this approach, a broad range of frequencies around the resonant frequency of fat are selectively masked out. In other terms, a stop-band is created around the around the resonant frequency of fat. Several proposed spectrally selective fat-suppression methods include fluctuating equilibrium magnetic resonance (FEMR), linear combination SSFP (LCSSFP), alternating TR (ATR) SSFP, and the use of binomial excitation patterns and/or periodic flip angle variations to suppress the fat signal. High RF linearity is required for methods in which the flip angle is varied or that use binomial excitation for suppressing fat. In many cases, the achieved level of suppression may not be enough to clearly depict the tissues of interest. Furthermore, the pass-band shape is usually non-uniform leading to decreased bandwidth and SNR performance. Some of the methods, including FEMR and LCSSFP, impose stringent constraints on the selection of the repetition time. Additionally, multiple acquisition methods, such as LCSSFP, require sequential acquisitions.

More particularly, LCSSFP uses two separate phase-cycled acquisitions and combines them to yield a spectral stop-band around the fat-resonance. The width of the stop-band and the separation between the pass-band and the stop-band is determined by the duration of the repetition time. On the other hand, ATR SSFP uses two different TR intervals consecutively performed to create a stop-band by aligning the spins precessing at the fat-resonance back to the longitudinal axis. Both FEMR and LCSSFP put stringent limitations on the possible repetition times, whereas fat suppressing ATR SSFP allows for a broader range of repetition times.

A drawback of multiple-acquisition spectrally selective methods, like LCSSFP, is the wedge-shape of the stop-band (s). The relatively broad stop-bands fail to yield sufficient suppression over a certain range(s) of frequencies in the stop-band, leading to a remnant fat signal comparable to a water signal. Therefore, in cases where there is moderate to large resonant frequency variations, the robustness of the fat suppression offered is hindered, essentially limiting the applicability of SSFP imaging. Furthermore, the pass-band shape is often compromised to achieve more fat suppression. Unfortunately, the resultant asymmetric pass-bands effectively reduce the bandwidth and SNR.

U.S. Pat. No. 6,307,368 by Vasanawala et al., issued Oct. 23, 2001 and entitled "Linear Combination Steady-State Free Precession MRI," which is incorporated by reference herein for all purposes, describes a steady-state free precession MRI process. U.S. Pat. No. 6,608,479 by Dixon et al., issued Aug. 19, 2003 and entitled, "Method and System for MRI with Lipid Suppression," which is also incorporated by reference herein for all purposes, describes another steady-state free precession MRI process.

This disclosure presents novel methods for spectrally selective imaging of different resonances comprising a multiple-TR SSFP scheme. The flexibility in the parameter selection further extends the applicability of SSFP imaging.

Example embodiments of the invention facilitate the use of SSFP imaging in applications where fat suppression is necessary to visualize the tissues of interest such as in coronary artery imaging, cartilage imaging, flow-independent angiography and where the ability of the separation of different resonances is valuable. The described methods offer robust suppression over a broad stop-band without compromising the homogeneity of the pass-band signal. Furthermore, the pass-band signal achieved may be more uniform than that of the balanced SSFP spectrum itself. Fat or water-suppressed SSFP imaging in the presence of large off-resonant frequency variations, high resolution and three-dimensional fat or water-suppressed SSFP imaging can be successfully accomplished with various embodiments of the invention.

Particular embodiments provide a method for suppressing the fat signal in SSFP imaging using multiple-repetition time (TR) SSFP acquisitions. A multiple-TR SSFP sequence, with a period consisting of N TR intervals, produces a periodic spectral response. The relative durations of the TR intervals determine the coefficients of the Fourier series representation of this response. More particularly, the relative durations may be arranged to form a sparse sampling pattern on a fine grid where the grid spacing is the greatest common divisor of all of the TR intervals. In the particular embodiments described, each multiple TR sequence exhibits mirror symmetry in terms of the durations of the multiple TR intervals about a center point of the multiple TR sequence.

Figure 1B:
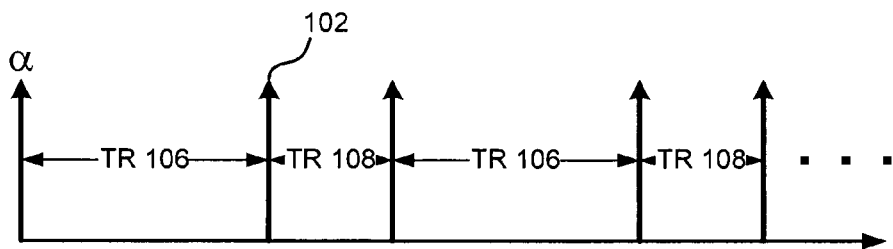
FIG. 1B illustrates an ATR SSFP TR interval sequence.
Figure 1C:
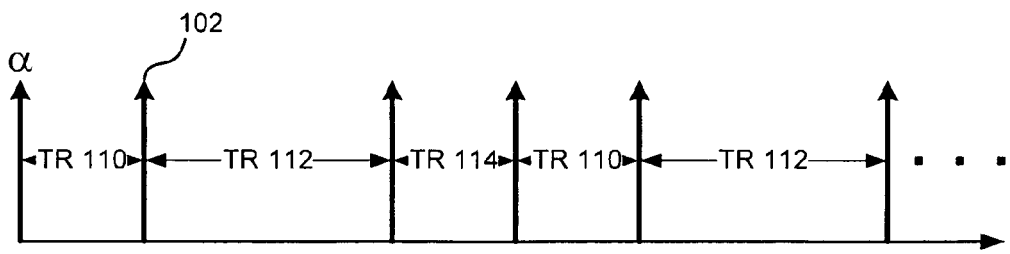
FIG. 1C illustrates a TR interval sequence in accordance with an example embodiment of the present invention.
Figure 1D:
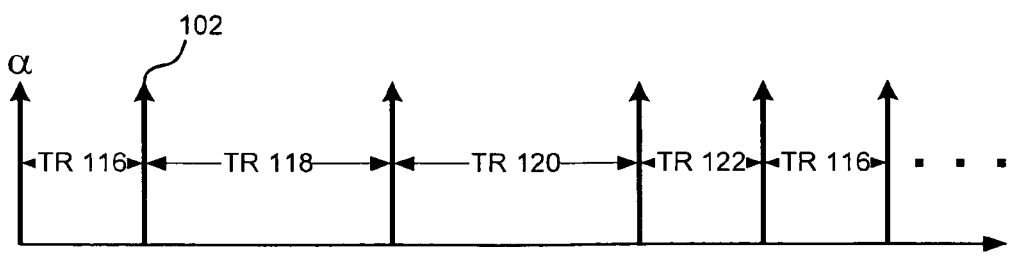
FIG. 1D illustrates another TR interval sequence in accordance with an example embodiment of the present invention.

FIGS. 1A-1D illustrate example sequences of RF excitations and associated TR intervals for balanced SSFP imaging (FIG. 1A), ATR-SSFP imaging (FIG. 1B) and two particular example embodiments of TR interval sequences in accordance with the present invention (FIGS. 1C and 1D). The upward pointing arrows represent the RF excitations 102. Each TR interval includes an associated RF excitation 102 at the beginning of the TR interval. As seen in FIG. 1A, conventional balanced SSFP sequences consist of a single TR interval 104 repeated over the entire acquisition. More particularly, each RF excitation 102 in each TR interval 104 has the same amplitude as all of the other RF excitations 102 and each TR interval 104 has the same duration as all of the other TR intervals 104 in the balanced SSFP sequence. As is well known in the art, the number of TR repetitions generally performed is largely a function of the desired image resolution and corresponds to the number of phase encodes required. By way of example, TR interval 104 may be repeated 256 times for two-dimensional imaging and 16384 (128×128) times for in vivo three-dimensional imaging.

FIG. 1B illustrates an example ATR SSFP sequence. ATR SSFP imaging utilizes a repeated sequence that consists of two distinctly different TR intervals, illustrated as TR 106 and TR 108 in FIG. 1B. Typically, the amplitudes of the RF excitations 102 remain the same in both TR 106 and TR 108. However, in contrast to conventional balanced SSFP, the first TR interval 106 has a substantially longer duration than the second TR interval 108. Also in contrast to conventional balanced SSFP, in which data is acquired in each and every TR interval 104, in ATR SSFP, data is typically acquired only in the longer TR interval 106.

FIG. 1C illustrates an example "1-3-1" sequence in accordance with one example embodiment of the present invention while FIG. 1D illustrates an example "1-2-2-1" sequence in accordance with another example embodiment of the present invention. The invention builds off of basic ATR SSFP imaging and increases the flexibility in shaping the spectral response. Like ATR SSFP, the sequences illustrated in FIGS. 1C and 1D include multiple TR intervals having differing durations. The TR intervals 110, 112 and 114 of FIG. 1C have associated durations D110, D112 and D114. In the illustrated embodiment, the duration D110 of the first TR interval 110 is approximately equal to the duration D114 of the third TR interval 114. The duration D112 of the second or middle TR interval 112 is approximately three times longer than the durations D110 and D114 of the first and third TR intervals 110 and 114, thus the referring of the sequence as a "1-3-1" sequence. It should be noted that, in this way, the "1-3-1" sequence is symmetric in terms of the duration of the TR intervals about the center point of the sequence. Additionally, in a particular embodiment, data is only acquired during the longer middle TR interval 112, and not during the first and third shorter TR intervals 110 and 114. It should also be noted that although the "1-3-1" sequence of FIG. 1C has been described and illustrated as starting with TR interval 110, this is for purposes of describing the mirror symmetry of the sequence, as the sequence may start with TR interval 112, and may thus be referred to as a "3-1-1" sequence (hereinafter the "1-3-1" sequence may be referred to as the "3-1-1" sequence). In other words, while the sequence may begin with any one of the three TR intervals 110, 112 and 114, the relative order of the TR intervals 110, 112 and 114 remains the same.

In the embodiment illustrated in FIG. 1D, the TR intervals 116, 118, 120 and 122 having associated durations D116, D118, D120 and D122, respectively. In the illustrated embodiment, the duration D116 of the first TR interval 116 is approximately equal to the duration D122 of the fourth TR interval 122 while the duration D118 of the second TR interval 118 is approximately equal to the duration D120 of the third TR interval 120. Additionally, the duration D118 (or D120) is approximately twice as long as the duration D116 (or D122), thus the referring of the sequence as a "1-2-2-1" sequence. In this way, the "1-2-2-1" sequence is also symmetric in terms of the duration of the TR intervals about the center point of the sequence. Additionally, in a particular embodiment, data is only acquired during the second and third longer TR intervals 112 and 114, and not during the first and fourth shorter TR intervals 110 and 116. Again, as described with reference to the "1-3-1" sequence, it should also be noted that the "1-2-2-1" sequence may not necessarily begin with TR interval 116. By way of example, the "1-2-2-1" sequence may begin with TR 118, and may thus be referred to as a "2-2-1-1" sequence (hereinafter the "1-2-2-1" sequence may be referred to as the "2-2-1-1" sequence).

In particular embodiments, all of the RF excitations 102 have the same tip angle. In this way, artifacts due to RF nonlinearity are avoided. Furthermore, in a preferred embodiment, the sign of every other RF excitation pulse is flipped. More particularly, in the example embodiment described above with reference to FIG. 1D, the sign of the RF excitation in TR 116 is opposite to that in TR 118, which is opposite to that in TR 120, which is, in turn, opposite to that in TR 122. Flipping the sign of every other RF pulse yields a zero net excitation at the water-resonance after a single sequence period (or two periods if N, the number of RF excitation pulses, is odd as in the "1-3-1" sequence of FIG. 1C) and creates a pass-band. Additionally, increasing N provides more degrees of freedom and, consequently, more flexibility in spectral shaping, but scan efficiency considerations limit the plausible set of sequences. As such, sequences with relatively few TR intervals may be desired.

As already stated, in particular embodiments, the TR interval pattern is symmetric in terms of the durations of the TR intervals about a center point of the TR sequence. That is, for a sequence having an even number of TR intervals (such as the "1-2-2-1" sequence of FIG. 1D), each TR interval has a "mirror partner" or counterpart in the opposite half of the sequence that has an identical duration (If there is an odd number of TR intervals, the same holds true except the center interval is its own mirror partner essentially). By way of example, TR 116 and TR 122 form such a mirror pair, as do TR 118 and TR 120. Furthermore, in some preferred embodiments, the excitation magnitude profiles in each of the TR interval mirror pairs are the same. By way of example, the magnetization in TR 116 may be equal to that in TR 122 while the magnetization in TR 118 may be equal to that in TR120. Thus, in various preferred embodiments, patterns with mirror symmetry and only a few TR intervals are desirable. By way of example, although the "1-3-1" sequence of FIG. 1C exhibits mirror symmetry and shows improved the pass-band performance; the inventors have determined that the "1-2-2-1" sequence described above with reference to FIG. 1D provides further improved pass-band performance and stop-band suppression (fat signal suppression for example) with scan efficiency that is comparable to ATR. The inventors have also determined that having the two longer TR intervals TR 118 and TR 120 adjacent one another provides favorable results.

Figure 2A:
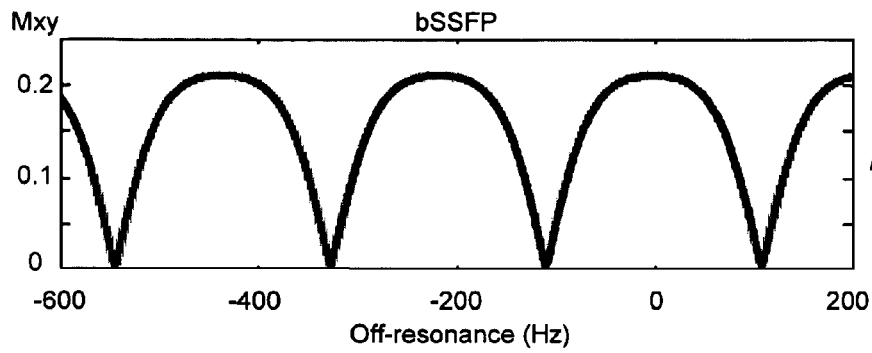
FIGS. 2A-2D illustrate magnetization versus frequency response profiles obtained from using the sequences of FIGS. 1A-1D.
Figure 2B:
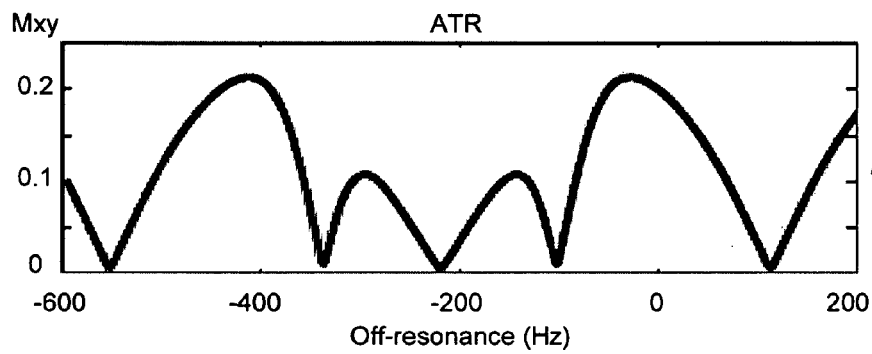
Figure 2C:
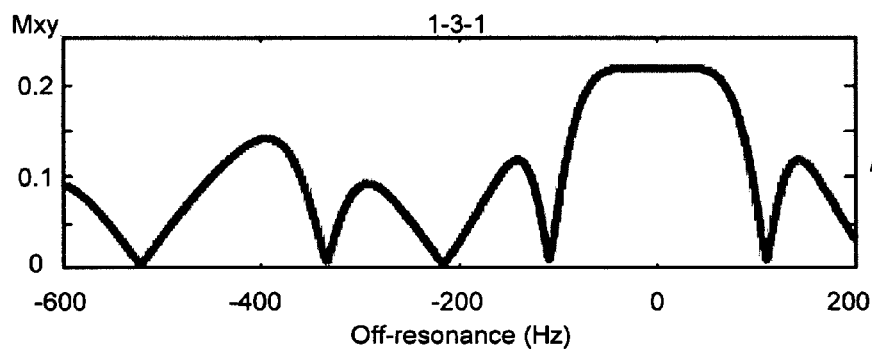
Figure 2D:
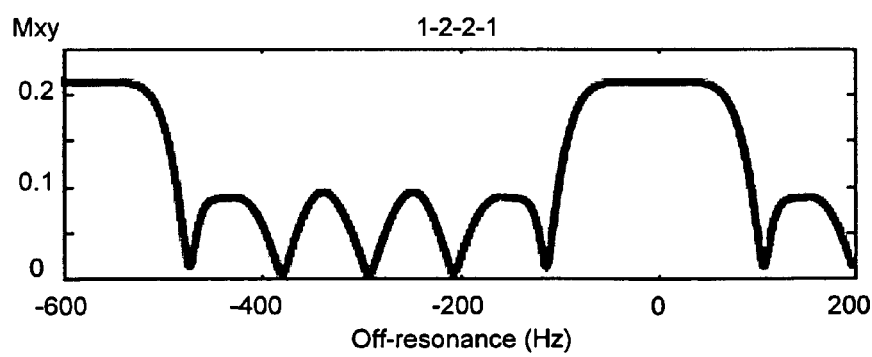

FIGS. 2A-2D illustrate transverse magnetization versus frequency profiles for the balanced SSFP, ATR-SSFP, "3-1-1", and "2-2-1-1" sequences, respectively, already described with reference to FIGS. 1A-1D. As is shown by FIG. 2B, the use of the ATR-SSFP sequence can produce a stop-band around the fat-resonance (−220 Hz at 1.5 T). However, the pass-band is far from uniform. In contrast, the profiles for both the "3-1-1" and "2-2-1-1" sequences show a uniform homogenous pass-band as well as a stop-band around the fat-resonance. Furthermore, as clearly illustrated by FIG. 2D, the profile for the "2-2-1-1" sequence shows a broader and flatter stop-band than that achieved using the "3-1-1" sequence or the ATR-SSFP sequence.

Figure 3:
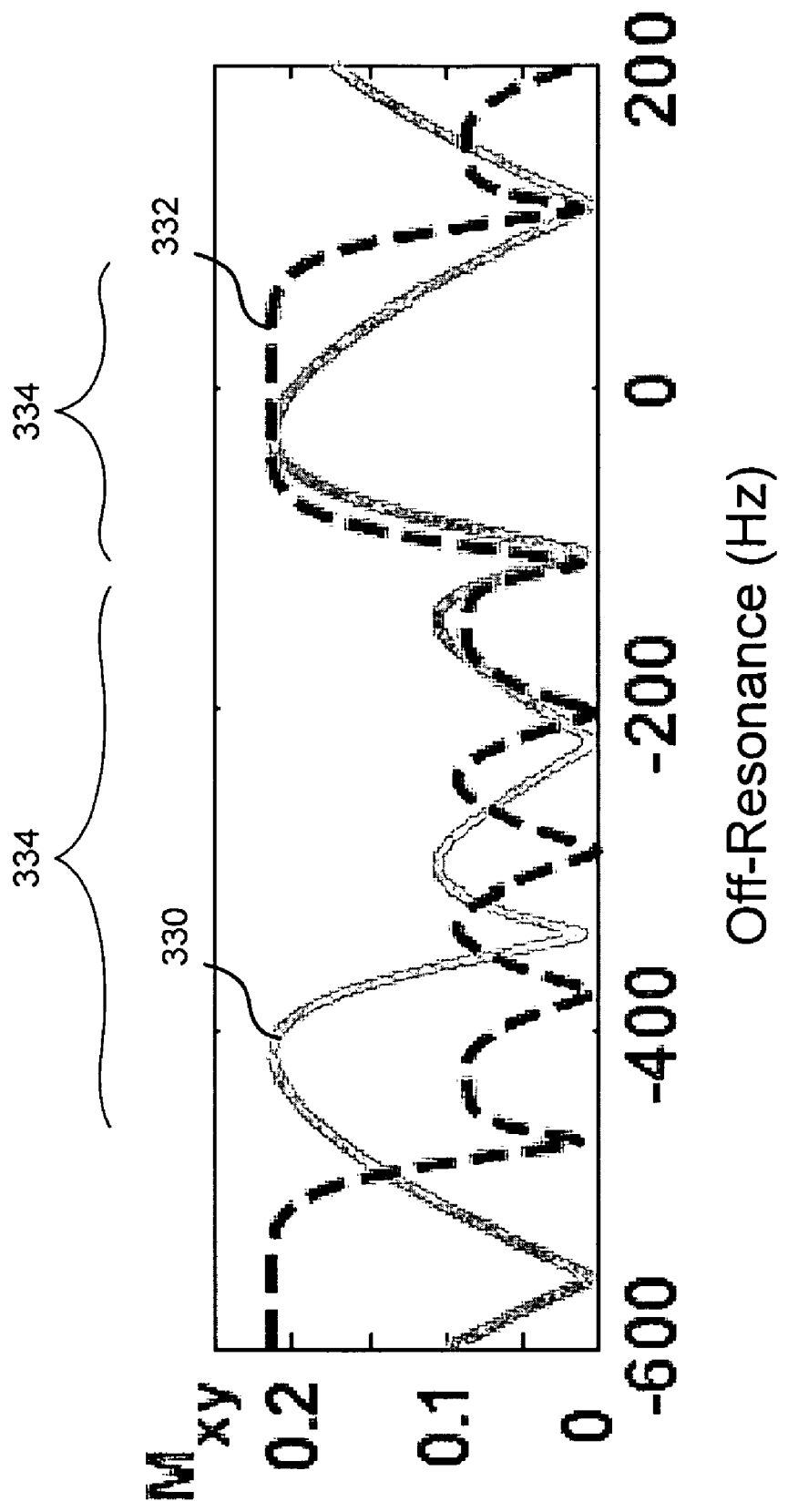
FIG. 3 illustrates a composite magnetization versus frequency response profile.

FIG. 3 illustrates a composite graph plotting the magnetization versus frequency profiles for the ATR-SSFP and "1-2-2-1" sequences overlapped. The solid gray curve 330 represents the response obtained for ATR-SSFP in which the flip angle α=60°, the ratio between the longitudinal (T1) and transverse (T2) relaxation times T1/T2=5, the duration of the first TR interval 106=3.45 ms and in which the duration of the second TR interval 108=1.15 ms. The dashed black curve 332 represents the response for the "1-2-2-1" sequence in accordance with an embodiment of the present invention with α=60α, T1/T2=5, D116=D122=1.725 ms and in which D18=D120=3.45 ms. As can be seen in FIG. 3, the stop-band 334 of the response 332 obtained with the "1-2-2-1" sequence is wider and further suppressed than the response 330 obtained using ATR, while the pass-band 336 of the response 332 is much more uniform than the response 330.

Figure 4A:
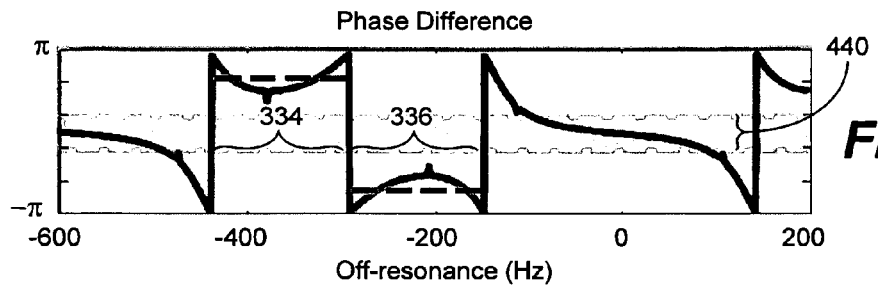
FIG. 4A illustrates a phase versus frequency response in accordance with an example embodiment of the present invention.
Figure 4B:
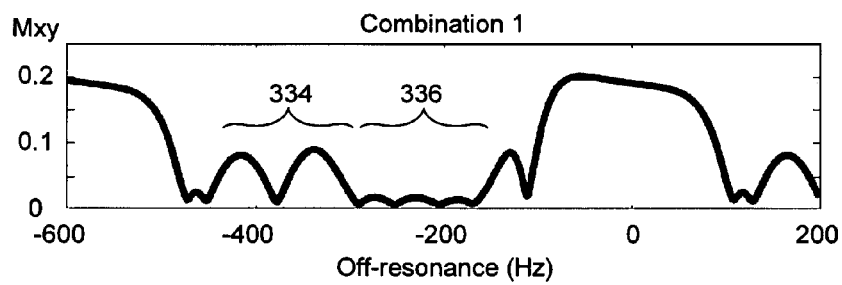
FIGS. 4B-4E illustrate magnetization versus frequency response profiles produced after generating various linear combinations of the data obtained from using the sequence of FIG. 1D.
Figure 4C:
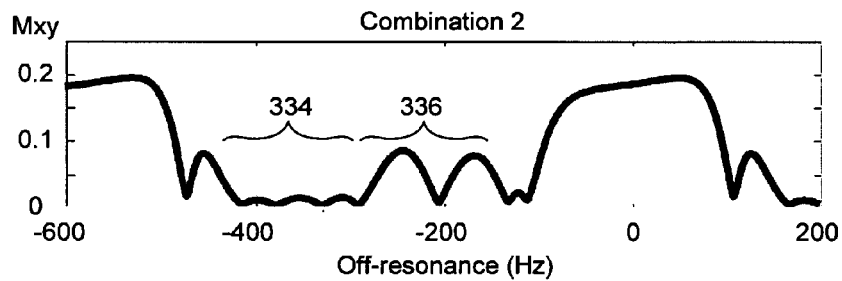
Figure 4D:
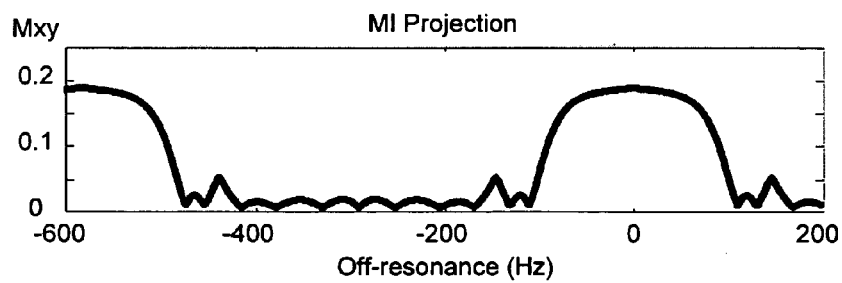
Figure 4E:
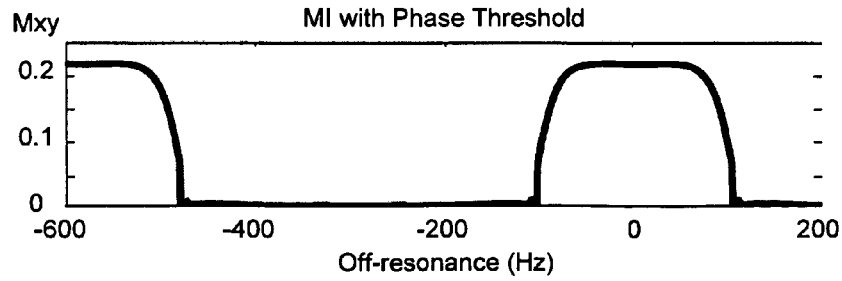

Furthermore, although the magnitude of the magnetization in the longer TR intervals 118 and 120 is the same for the '1-2-2-1' sequence, there is a non-linear phase difference that increases with off-resonance as illustrated in FIG. 4A. While this difference is bounded to a small range 440 (indicated with gray) for the pass-band, it becomes significant in the stop-band. Furthermore, it can be observed that the phase difference assumes two different mean values (marked with dashed black lines in FIG. 4A) for two separate frequency ranges 442 and 444 within the stop-band. The two echoes (one echo in each of TR 118 and TR 120, respectively) can be put out of phase over a desired frequency band. In particular embodiments, the echoes are put out of phase within either of the two frequency ranges 442 and 444. Once the echoes are put out-of-phase, the signals may be linearly combined to improve suppression. However, if the magnitudes are not exactly the same, weighting the echoes by a power of their magnitude prior to summation will yield improved suppression. By way of example, a subsequent summation of the data signals taken over TR 118 and TR 120 further improves the suppression of the stop-band through phase cancellation as illustrated in FIGS. 4B and 4C. In the illustrated examples, selective phase-cancellation improves stop-band suppression around −220 Hz as shown in FIG. 4B and at −370 Hz as shown in FIG. 4C. More particularly, note that in FIG. 4B, the echoes are put out of phase such that the right half of the stop-band corresponding to range 336 (centered around −220 Hz) is further suppressed as compared to that observed in FIG. 2D without summation. Similarly, in FIG. 4C, the echoes are put out of phase such that the left half of the stop-band corresponding to range 334 (centered around −370 Hz) is further suppressed as compared to that observed in FIG. 2D. Furthermore, a minimum intensity (MI) projection of these two combinations can further enhance suppression as illustrated in FIG. 4D. The MI projection may achieve this improvement over the whole stop-band. Furthermore, in some embodiments, it may be desirable to threshold the phase difference and apply the linear combination only to the stop-band frequencies. The pass-band signals, meanwhile, may be combined with a sum-of-squares approach. In this way, the SNR may be improved while degradation of the pass-band signal can be avoided.

It should be noted that the TR interval duration can be adjusted to move the center of the second half of the stop-band from −370 Hz to −440 Hz (the fat-resonance at 3 T). By way of example, if the TR interval durations D116 and D118 are scaled down using the same constant to 1.5 ms and 3 ms, respectively, the frequency response gets wider and the center of the stop-band becomes −440 Hz.

The effective stop-band suppression using the "3-1-1" and "1-2-2-1" sequences was further demonstrated with phantom images. A spatially varying precession frequency was generated by a linear field gradient in the vertical direction. Water and fat resonances at 1.5 T are marked with dashed black and white lines 550 and 552, respectively. FIG. 5A illustrates an image resulting from an ATR-SSFP sequence while FIG. 5B illustrates an image resulting from the utilization of the "3-1-1" profile and FIG. 5C illustrates an image resulting from the utilization of the "1-2-2-1" profile. As demonstrated in FIGS. 5A-5C, the "3-1-1" and "1-2-2-1" sequences yield significantly more uniform pass-bands than ATR-SSFP. Furthermore, the "1-2-2-1" sequence produces the broadest stop-band and the highest level of suppression. As described above with reference to FIGS. 4B and 4C, the suppression in separate segments of the stop-band can be further improved independently with appropriate linear combinations as shown in FIGS. 5D and 5E. Lastly, FIG. 5F shows a phantom image in which a minimum-intensity projection of the combinations was used to enhance suppression over the whole stop-band.

One potential application of the described methods is SSFP-based MR angiography. FIGS. 6A-D and 7A-D illustrate SSFP lower leg images acquired on 1.5 T and 3 T GE Signa scanners, respectively. FIG. 6A illustrates an image using ATR SSFP and FIG. 6B illustrates an image using a "1-2-2-1" sequence, while FIGS. 6C and 6D illustrate the corresponding whole volume maximum-intensity projection (MIP) images, respectively, at 1.5 T. Similarly, FIG. 7A illustrates an image using ATR SSFP, FIG. 7B illustrates an image using a "1-2-2-1" sequence and FIGS. 7C and 7D illustrate the corresponding whole volume MIP images, respectively, at 3 T. The acquisition parameters were: α=60°, isotropic 1 mm resolution, 125 kHz BW, 26 cm field-of-view (FOV) and 22 cm FOV, respectively, for 1.5 T and 3 T, and NEX=2 for ATR. At 1.5 T, the TR intervals 116, 118, 120 and 122 had durations D116=1.725 ms, D118=3.45 ms, D120=3.45 ms, and D122=1.725 ms, respectively, while for the ATR sequence in FIG. 6C, the duration of the first TR interval 106=3.45 ms and the duration of the second TR interval 108=1.15 ms. The acquisition times were 2 minutes 50 seconds and 2 minutes 30 seconds, respectively. In the example "1-2-2-1" sequence illustrated in FIG. 7D, D116=D122=1.36 ms and D118=D120=3 ms, while in FIG. 7C for ATR, the duration of the first TR interval 106=3.38 ms and the duration of the second TR interval 108=1.12 ms. The acquisition times were 2 minutes 40 seconds and 2 minutes 46 seconds, respectively. FIGS. 6A-6B and 7A-7B display the fat-suppressed images using ATR (FIGS. 6A and 7A) and the "1-2-2-1" sequence (FIGS. 6B and 7B) along with the corresponding MIPs in FIGS. 6C-6D and 7C-7D. As seen in both FIGS. 6A-6D and 7A-7D, the embodiment using the "1-2-2-1" sequence achieves more robust fat suppression than the ATR sequence.

Figure 8:
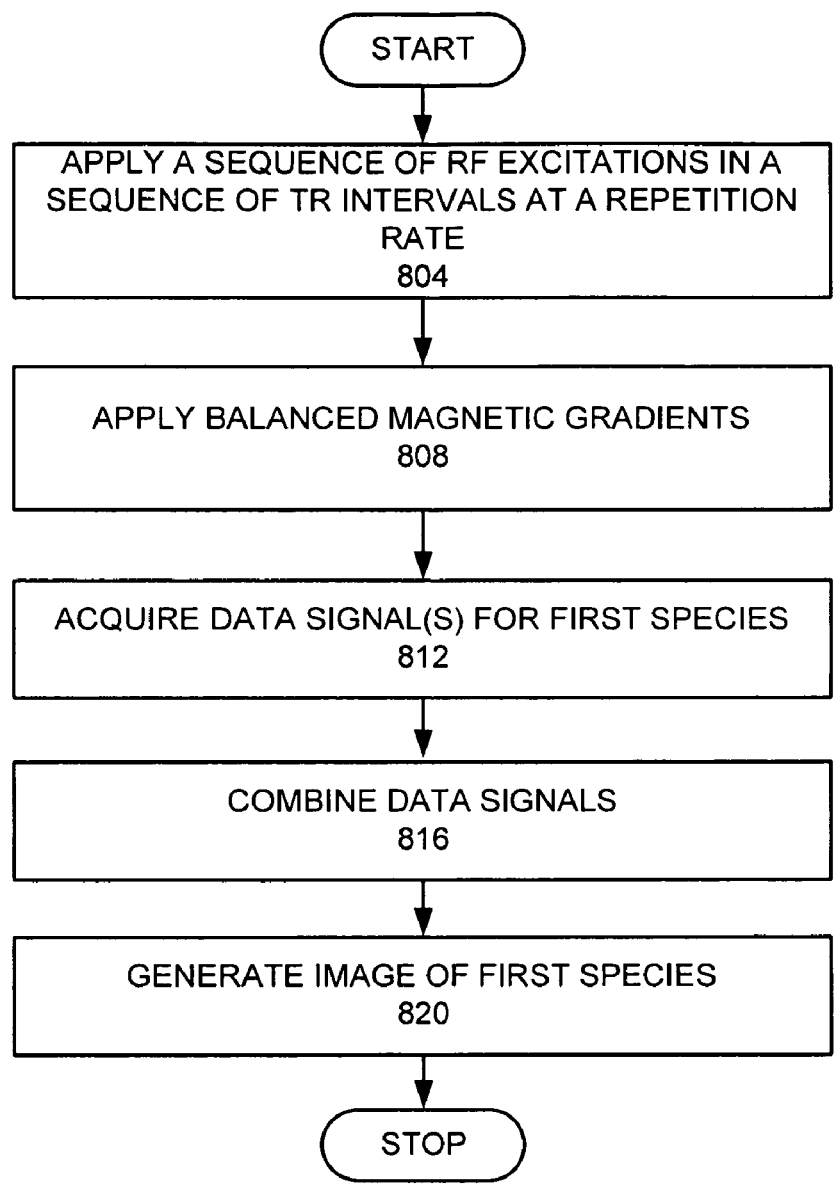
FIG. 8 is a high level flow chart of an embodiment of the invention.

FIG. 8 is a high level flow chart of a general embodiment of the invention. A sequence of radio frequency (RF) excitation pulses are repeatedly applied at a repetition rate (step 804). More specifically, the sequence of RF pulses are applied in a sequence of TR intervals, with each RF pulse being applied in an associated TR interval. In one embodiment, the sequence of TR intervals includes at least one TR interval in which data is acquired and at least two secondary TR intervals each having a duration that is shorter than the TR interval in which data is acquired. In another embodiment, the sequence of TR intervals includes at least two adjacent TR intervals in which data is acquired. Balanced magnetic gradients are also applied (step 808). For balanced processes the net area under the gradient is zero. A data signal is acquired for a first species during each TR interval in which data is acquired (step 812). In embodiments in which there are at least two TR intervals in which data is acquired, the data signals obtained for the first species in each TR interval may be combined (step 816). An image is generated of the first species with the data signal for the first species in which a second species is suppressed (step 820).

Figure 9:
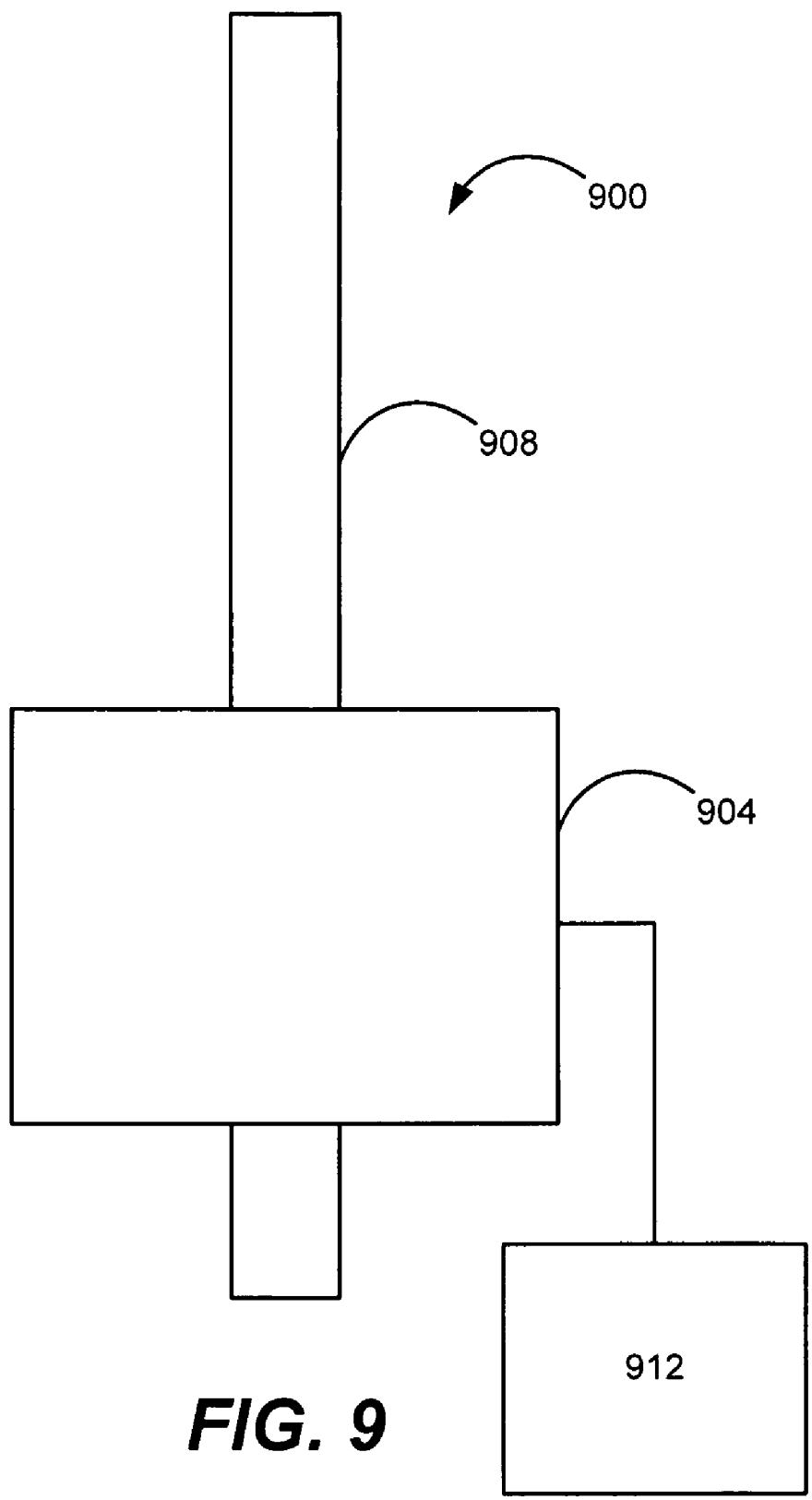
FIG. 9 is a schematic top view of a magnetic resonance imaging (MRI) system that may be used in an embodiment of the invention.

FIG. 9 is a schematic top view of a magnetic resonance imaging (MRI) system 900 that may be used in an embodiment of the invention. The MRI system 900 comprises a magnet system 904, a patient transport table 908 connected to the magnet system, and a controller 912 controllably connected to the magnet system. In one example, a patient would lie on the patient transport table 908 and the magnet system 904 would pass around the patient. The controller 912 would control magnetic fields and radio frequency (RF) signals provided by the magnet system 904 and would receive signals from detectors in the magnet system 904.

Figure 10A:
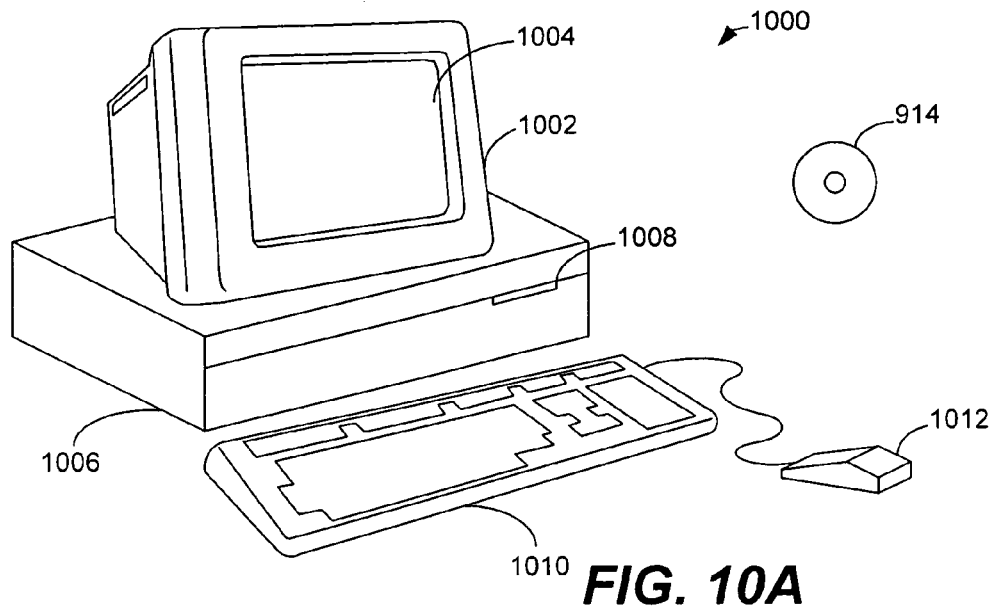
FIGS. 10A and 10B illustrate a computer system that may be used in an embodiment of the invention.
Figure 10B:
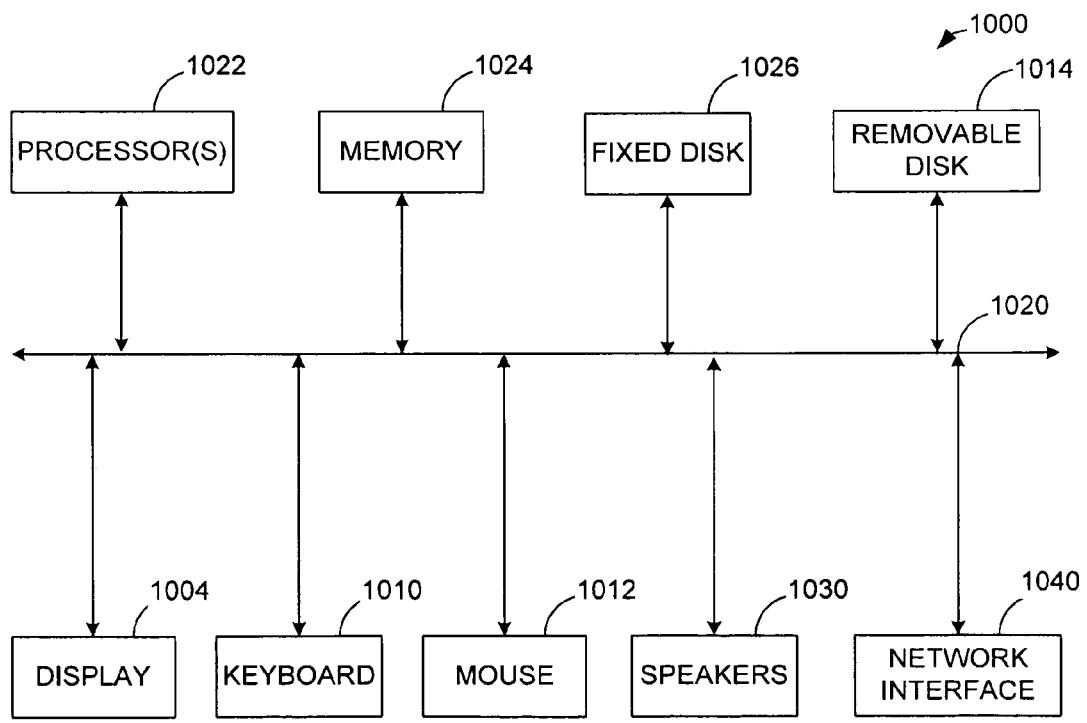

FIGS. 10A and 10B illustrate a computer system 1000, which is suitable for implementing a controller 1012 used in embodiments of the present invention. FIG. 10A shows one possible physical form of the computer system. Of course, the computer system may have many physical forms ranging from an integrated circuit, a printed circuit board, and a small handheld device up to a huge super computer. Computer system 1000 includes a monitor 1002, a display 1004, a housing 1006, a disk drive 1008, a keyboard 1010, and a mouse 1012. Disk 1014 is a computer-readable medium used to transfer data to and from computer system 1000.

FIG. 10B is an example of a block diagram for computer system 1000. Attached to system bus 1020 are a wide variety of subsystems. Processor(s) 1022 (also referred to as central processing units, or CPUs) are coupled to storage devices, including memory 1024. Memory 1024 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 1026 is also coupled bi-directionally to CPU 1022; it provides additional data storage capacity and may also include any of the computer-readable media described below. Fixed disk 1026 may be used to store programs, data, and the like and is typically a secondary storage medium (such as a hard disk) that is slower than primary storage. It will be appreciated that the information retained within fixed disk 1026 may, in appropriate cases, be incorporated in standard fashion as virtual memory in memory 1024. Removable disk 1014 may take the form of the computer-readable media described below.

CPU 1022 is also coupled to a variety of input/output devices, such as display 1004, keyboard 1010, mouse 1012, and speakers 1030. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 1022 optionally may be coupled to another computer or telecommunications network using network interface 1040. With such a network interface, it is contemplated that the CPU might receive information from the network, or might output information to the network in the course of performing the above-described method steps. Furthermore, method embodiments of the present invention may execute solely upon CPU 1022 or may execute over a network such as the Internet in conjunction with a remote CPU that shares a portion of the processing.

In addition, embodiments of the present invention further relate to computer storage products with a computer-readable medium that has computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

In conclusion, various embodiments utilize a multiple-TR SSFP scheme to achieve superior suppression of the signal in the stop-band and better the visualization of the structures of interest. In addition, the pass-band is more uniform in-shape than other prior art methods giving increased imaging bandwidth and higher SNR efficiency. It should be noted, that although described with reference to specific embodiments and parameters, the selection of the TR interval durations is also flexible as in ATR, allowing application-specific adjustments to the imaging parameters. Since the two echoes are acquired in an interleaved manner, the sensitivity to motion artifacts is reduced compared to sequential methods.

The foregoing description, for purposes of explanation, used specific examples to provide a thorough understanding of the invention. However, it will be apparent to one skilled in the art that the specific details are not required in order to practice the invention. Thus, the foregoing descriptions of specific embodiments of the present invention are presented for purposes of illustration and description. They are not intended to be exhaustive or to limit the invention to the precise forms disclosed. It will be apparent to one of ordinary skill in the art that many modifications and variations are possible in view of the above teachings.

For instance, although the results obtained using the specific "1-2-2-1" sequence were described, it should be noted that in other embodiments the durations D118 and D120 of the longer data acquisition TR intervals need not be exactly twice that of the durations D 116 and D122. However, the inventors have determined that this 2-to-1 ratio yields favorable results.

Additionally, although the described "1-2-2-1" sequence included four total TR intervals and two TR intervals in which data was acquired, it should be noted that in other embodiments, more than 4 total TR intervals and 2 data acquisition TR intervals may be desired as long as the sequences are substantially symmetric in terms of duration.

Furthermore, in some embodiments the flip angles, RF phases and RF excitation amplitudes may be also be varied. SSFP data from acquisitions with varying flip angles and RF phases (other than simple chopping) coupled with the varying repetition times can also help to improve the performance of the method. Additionally, if an off-resonance map is acquired along with the proposed method, then the two echoes can be put out-of-phase at each frequency (equivalently at each voxel) in the stop-band separately. Meanwhile, within the pass-band the two echoes can be put in phase and summed to optimize SNR. Finally, the results of these operations yielding image voxels can be combined.

The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

What is claimed is:

1. A method of providing selective spectral suppression in balanced steady-state free procession (SSFP) magnetic resonance imaging for a first species and a second species, comprising:
   acquiring a plurality of balanced SSFP images, wherein each acquisition of a balanced SSFP image comprises:
   applying a sequence of radio frequency (RF) excitations in a sequence of TR intervals, each RF excitation being applied in an associated TR interval, the sequence of TR intervals including at least one data acquisition TR interval and at least two secondary TR intervals each having a duration that is substantially shorter than a duration of the at least one data acquisition TR interval, a first one of the secondary TR intervals preceding the at least one data acquisition TR interval and a second one of the secondary TR intervals following the at least one data acquisition TR interval, the duration of the second one of the secondary TR intervals being substantially equal to the duration of the first one of the secondary TR intervals such that the sequence of TR intervals is substantially symmetric with respect to duration about a center point of the sequence of TR intervals;
   applying balanced magnetic gradients;
   acquiring a data signal for the first species during each of the at least one data acquisition TR intervals while suppressing a signal from the second species; and
   generating an image of the first species with the data signal from the first species in which the signal from the second species is suppressed.

2. A method as recited in claim 1, wherein data is not acquired during the secondary TR intervals.

3. A method as recited in claim 2, wherein the at least one data acquisition TR interval comprises at least two adjacent data acquisition TR intervals, a first one of the at least two adjacent data acquisition TR intervals having a duration that is substantially equal to the duration of a second one of the at least two adjacent data acquisition TR intervals, wherein the first one of the secondary TR intervals precedes the at least two data acquisition TR intervals and the second one of the secondary TR intervals follows the at least two data acquisition TR intervals.

4. A method as recited in claim 3, further comprising configuring the excitation during the second data acquisition TR interval such that the data signal during the second data acquisition TR interval is out of phase with respect to the data signal during the first data acquisition TR interval at a resonant frequency of the second species.

5. A method as recited in claim 4, further comprising combining the data signal acquired during the first data acquisition TR interval with the data signal acquired during the second data acquisition TR interval to generate the image of the first species.

6. A method as recited in claim 3, wherein the amplitude of the RF excitation in the first data acquisition TR interval is substantially equal to the amplitude of the RF excitation in the second data acquisition TR interval.

7. A method as recited in claim 3, wherein all of the RF excitations in the sequence have the same tip angle.

8. A method as recited in claim 3, wherein each excitation has an opposite sign as compared to the excitations immediately preceding and immediately following the excitation.

9. A method as recited in claim 3, wherein the sequence includes three data acquisition TR intervals, wherein a third data acquisition TR interval is located in time between the first and the second data acquisition TR intervals, wherein a duration of the third data acquisition TR interval is at least as long as each of the durations of the first and second data acquisition TR intervals.

10. A method as recited in claim 1, wherein the amplitudes of the RF excitations in all of the TR intervals are substantially the same.

11. A method as recited in claim 3, wherein the duration of each of the first and second secondary TR intervals is approximately half of the duration of each of the first and second data acquisition TR intervals.

12. A method as recited in claim 1, wherein the first species is water and the second species is fat.

13. A method of providing selective spectral suppression in balanced steady-state free procession (SSFP) magnetic resonance imaging for a first species and a second species, comprising:
   acquiring a plurality of balanced SSFP images, wherein each acquisition of a balanced SSFP image comprises:
   applying a sequence of radio frequency (RF) excitations in a sequence of TR intervals, each excitation being applied in an associated TR interval, the sequence of TR intervals including two adjacent data acquisition TR intervals and at least one secondary TR interval, each secondary TR interval having a duration that is substantially shorter than a duration of each of the data acquisition TR intervals;

applying balanced magnetic gradients;

acquiring a data signal for the first species during each of the data acquisition TR intervals while suppressing a signal from the second species;

combining the data signals from the data acquisition TR intervals to further suppress the signal from the second species; and generating a combined image of the first species with the combined data signals in which the signal from the second species is suppressed.

14. A method as recited in claim 13, wherein the at least one secondary TR interval comprises at least two secondary TR intervals, a first one of the secondary TR intervals preceding a first one of the data acquisition TR intervals and a second one of the secondary TR intervals following a second one of the data acquisition TR intervals.

15. A method as recited in claim 14, wherein the duration of the first data acquisition TR interval is substantially equal to the duration of the second data acquisition TR interval and wherein the duration of the first secondary TR interval is substantially equal to the duration of the second secondary TR interval such that the sequence of TR intervals is substantially symmetric with respect to duration about a center point of the sequence of TR intervals.

16. An apparatus, comprising:

a magnet system;

a controller electrically connected to the magnet system, comprising:

a display;

at least one processor; and computer readable media, comprising:

computer readable code executable by the at least one processor for acquiring a plurality of balanced SSFP images, wherein for each SSFP image the computer readable code is operable to:

apply a sequence of radio frequency (RF) excitations in a sequence of TR intervals, each RF excitation being applied in an associated TR interval, the sequence of TR intervals including at least one data acquisition TR interval and at least two secondary TR intervals each having a duration that is substantially shorter than a duration of the at least one data acquisition TR interval, a first one of the secondary TR intervals preceding the at least one data acquisition TR interval and a second one of the secondary TR intervals following the at least one data acquisition TR interval, the duration of the second one of the secondary TR intervals being substantially equal to the duration of the first one of the secondary TR intervals such that the sequence of TR intervals is substantially symmetric with respect to duration about a center point of the sequence of TR intervals;

apply balanced magnetic gradients;

acquire a data signal for the first species during each of the at least one data acquisition TR intervals while suppressing a signal from the second species; and generate an image of the first species with the data signal from the first species in which the signal from the second species is suppressed.

* * * * *